US007305097B2

(12) United States Patent
Rosen et al.

(10) Patent No.: US 7,305,097 B2
(45) Date of Patent: Dec. 4, 2007

(54) CONTROLLING FADING AND SURROUND SIGNAL LEVEL

(75) Inventors: Michael D. Rosen, Auburndale, MA (US); Tobe Barksdale, Bolton, MA (US); Christopher Ludwig, Northborough, MA (US)

(73) Assignee: Bose Corporation, Framingham, MA (US)

( * ) Notice: Subject to any disclaimer, the term of this patent is extended or adjusted under 35 U.S.C. 154(b) by 679 days.

(21) Appl. No.: 10/367,251

(22) Filed: Feb. 14, 2003

(65) Prior Publication Data

US 2004/0161126 A1 Aug. 19, 2004

(51) Int. Cl.

*H04R 5/03* (2006.01)
*H04R 5/00* (2006.01)
*H04B 1/00* (2006.01)
*H02B 1/00* (2006.01)
*H03G 3/00* (2006.01)
*G10H 1/08* (2006.01)

(52) U.S. Cl. ...................... 381/307; 381/119; 381/306; 381/123; 381/61; 381/18; 84/625; 84/660

(58) Field of Classification Search ................ 381/307, 381/119, 306, 59, 123, 86, 104, 18, 109, 61; 700/94; 84/625, 660, 697

See application file for complete search history.

(56) References Cited

U.S. PATENT DOCUMENTS 3,702,901 A * 11/1972 Cherry ........................ 381/19
4,682,364 A * 7/1987 Dunnebacke ............... 381/109
4,953,213 A * 8/1990 Tasaki et al. ............... 381/307
5,068,897 A * 11/1991 Yamato et al. .............. 381/302
5,073,944 A * 12/1991 Hirasa ......................... 381/86
5,122,720 A * 6/1992 Martinson et al. .......... 318/663
5,212,733 A * 5/1993 DeVitt et al. ............... 381/119
5,513,268 A * 4/1996 Bironas et al. ............. 381/109
5,530,760 A * 6/1996 Paisley ........................ 381/27

(Continued)

FOREIGN PATENT DOCUMENTS

EP 0352627 1/1990

(Continued)

OTHER PUBLICATIONS

European Search Report dated Jun. 21, 2007, issued in European Application No. 06110452.7, filed Feb. 27, 2006.

*Primary Examiner*—Vivian Chin
*Assistant Examiner*—Devona E Faulk
(74) *Attorney, Agent, or Firm*—Fish & Richardson P.C.

(57) ABSTRACT

Systems and techniques for controlling a surround sound system having multiple input signals and multiple spatially diverse transducers may include defining a first control region and a second control region. When operating in the first control region, a first set of functions is performed. For example, for each of the spatially diverse transducers, an input signal may be selected, a relative strength of the selected input signal may be adjusted, and the adjusted input signal may be applied to the transducer. When operating in the second control region, a second set of functions is performed. For example, for each of the spatially diverse transducers, two or more input signals may be selected, a relative strength of the selected input signals may be adjusted, the adjusted input signals may be mixed, and the mixed input signals may be applied to the transducer.

38 Claims, 6 Drawing Sheets

U.S. PATENT DOCUMENTS

| | | | | | |
|---|---|---|---|---|---|
| 5,812,688 | A * | 9/1998 | Gibson | 381/119 |
| 6,154,549 | A * | 11/2000 | Arnold et al. | 381/104 |
| 6,167,140 | A * | 12/2000 | Watanabe | 381/123 |
| 6,813,361 | B1 | 11/2004 | Jeffs | |
| 6,977,653 | B1 * | 12/2005 | Cleary et al. | 345/440 |
| 2001/0022841 | A1 * | 9/2001 | Motojima et al. | 381/27 |
| 2002/0031236 | A1 * | 3/2002 | Shimizu et al. | 381/104 |
| 2002/0131611 | A1 * | 9/2002 | Hoover et al. | 381/123 |
| 2003/0076966 | A1 * | 4/2003 | Okabayashi | 381/119 |

FOREIGN PATENT DOCUMENTS

| | | | |
|---|---|---|---|
| EP | 352627 | A2 * | 1/1990 |
| EP | 1469705 | | 10/2004 |
| WO | WO/9911100 | | 3/1999 |
| WO | WO 9911100 | A1 * | 3/1999 |

* cited by examiner

FIG. 3

250

CONTROL POSITION 255

| 1 | 2 | 3 | 4 | 5 | 6 | 7 | 8 |
|---|---|---|---|---|---|---|---|
| 280<br>FL=0 dB<br>SL=-1.5 dB | FL=0 dB<br>SL=-1.5 dB | 285-1<br>FL=0 dB<br>SL=-3 dB | FL=0 dB<br>SL=-6 dB | FL=0 dB | FL=0 dB | FL=0 dB | FL=0 dB |
| FR=0 dB<br>SR=-1.5 dB | FR=0 dB<br>SR=-1.5 dB | FR=0 dB<br>SR=-3 dB | FR=0 dB<br>SR=-6 dB | FR=0 dB | FR=0 dB | FR=0 dB | FR=0 dB |
| C=0 dB | C=0 dB | C=0 dB | C=0 dB | C=0 dB | C=0 dB | C=0 dB | C=0 dB |
| 285-3<br>FL=-60 dB<br>SL=-60 dB | FL=-14 dB<br>SL=-17 dB | 285-2<br>FL=-9 dB<br>SL=-13 dB | FL=-6 dB<br>SL=-9 dB | SL=-5 dB | SL=-3 dB | 288-1<br>SL=-1.5 dB | SL=0 dB |
| 285-4<br>FR=-60 dB<br>SR=-60 dB | FR=-14 dB<br>SR=-17 dB | FR=-9 dB<br>SR=-13 dB | FR=-6 dB<br>SR=-9 dB | SR=-5 dB | SR=-3 dB | 288-2<br>SR=-1.5 dB | SR=0 dB |
| 285-5<br>LFE=0 dB | LFE=0 dB | LFE=0 dB | LFE=0 dB | LFE=0 dB | LFE=0 dB | LFE=0 dB | LFE=0 dB |

FIG. 3A

CONTROL POSITION

| 9 | 10 | 11 | 12 | 13 | 14 | 15 | |
|---|---|---|---|---|---|---|---|
| FL=0 dB | FL=0 dB | FL=0 dB | FL=-4 dB<br>SL=-6 dB | 295-1<br>FL=-8 dB<br>SL=-10 dB | FL=-13 dB<br>SL=-15 dB | 295-3<br>FL=-60 dB<br>SL=-60 dB | → 80 FL-T |
| FR=0 dB | FR=0 dB | FR=0 dB | FR=-4 dB<br>SR=-6 dB | FL=-8 dB<br>SL=-10 dB | FR=-13 dB<br>SR=-15 dB | 295-4<br>FR=-60 dB<br>SR=-60 dB | → 100 FR-T |
| C=0 dB | C=0 dB | C=0 dB | C=-4 dB | C=-8 dB | C=-15 dB | 295-4<br>C=-60 dB | → 90 C-T |
| 287-1<br>SL=1.5 dB | SL=3 dB | SL=5 dB | 290<br>FL=-1.5 dB<br>C=-1.5 dB<br>SL=-1.5 dB | 295-2<br>FL=-1.5 dB<br>C=-1.5 dB<br>SL=-1.5 dB | FL=-1.5 dB<br>C=-1.5 dB<br>SL=-1.5 dB | 295-6<br>FR=0 dB<br>C=0 dB<br>SR=0 dB | → 110 SL-T |
| 287-2<br>SL=1.5 dB | SR=3 dB | SR=5 dB | FR=-1.5 dB<br>C=-1.5 dB<br>SR=-1.5 dB | FR=-1.5 dB<br>C=-1.5 dB<br>SR=-1.5 dB | FR=-1.5 dB<br>C=-1.5 dB<br>SR=-1.5 dB | 295-7<br>FR=0 dB<br>C=0 dB<br>SR=0 dB | → 130 SR-T |
| LFE=0 dB | LFE=0 dB | LFE=0 dB | LFE=0 dB | LFE=0 dB | LFE=0 dB | LFE=0 dB | → 120 LFE-T |

260

FIG. 3B 505 500

FINER CONTROL POSITION IN TRANSITION REGION

| 11 | 1' | 2' | 3' | 12 | |
|---|---|---|---|---|---|
| 600-1<br>FL=0 dB | FL=-1 dB<br>SL=-60 dB | FL=-2 dB<br>SL=-30 dB | FL=-3 dB<br>SL=-10 dB | 600-2<br>FL=-4 dB<br>SL=-6 dB | FL-S 80 |
| FR=0 dB | FR=-1 dB<br>SR=-60 dB | FR=-2 dB<br>SR=-30 dB | FR=-3 dB<br>SR=-10 dB | FL=-4 dB<br>SL=-6 dB | FR-S 100 |
| C=0 dB | C=-1 dB | C=-2 dB | C=-3 dB | C=-4 dB | C-S 90 |
| 610-1<br>SL=5 dB | FL=-60 dB<br>C=-60 dB<br>SL=3 dB | FL=-30 dB<br>C=-30 dB<br>SL=1 dB | FL=-5 dB<br>C=-5 dB<br>SL=0 dB | 610-2<br>FL=-1.5 dB<br>C=-1.5 dB<br>SL=-1.5 dB | SL-S 110 |
| SR=5 dB | FR=-60 dB<br>C=-60 dB<br>SR=3 dB | FR=-30 dB<br>C=-30 dB<br>SR=1 dB | FR=-5 dB<br>C=-5 dB<br>SR=0 dB | FR=-1.5 dB<br>C=-1.5 dB<br>SR=-1.5 dB | SR-S 130 |
| LFE=0 dB | LFE=0 dB | LFE=0 dB | LFE=0 dB | LFE=0 dB | LFE-S 120 |

510

FIG. 5

CONTROLLING FADING AND SURROUND SIGNAL LEVEL

This invention relates to audio systems, and more particularly to fading and signal level controls for surround sound audio systems.

BACKGROUND OF THE INVENTION

Audio systems with surround sound features are prevalent in theaters, home entertainment systems, and automobiles. In general, surround sound features enhance the overall listening experience by increasing the aural stimulations associated with music, motion picture soundtracks, and other audio performances. The surround sound capability is provided by using a collection of spatially diverse speakers. Typically, primary (or front) speakers are located in front of the listener or audience and surround sound speakers are located behind and/or to the sides of the listener or audience. Surround sound processing of an audio input controls the signal that is sent to each speaker and causes each speaker to produce a different audio output. As a result, listeners may be presented with the sensation of being seemingly surrounded by sound and/or with the sensation of sound originating from a particular direction.

SUMMARY OF THE INVENTION

Systems and techniques are provided for using a single control device to control a surround system that includes multiple input signals and multiple spatially diverse transducers. The operating range of the control device may be divided into two or more control regions. Each region may correspond to a different control function. In one implementation, a first control region may control a strength of one or more audio surround source signals relative to one or more audio front source signals. A second control region may control mixing of the audio surround source signals and the audio front source signals in addition to controlling the relative strengths of the audio surround source signals and the audio front source signals.

In one general aspect, a method and system for controlling a surround sound system with multiple input signals and multiple spatially diverse transducers includes defining a first control region and a second control region. A first set of control functions are applied when operating in the first control region. In particular, for each of the spatially diverse transducers, an input signal is selected, a relative strength of the selected input signal is adjusted, and the adjusted input signal is applied to the transducer. A second set of control functions are applied when operating in the second control region. In particular, for each of the spatially diverse transducers, two or more input signals are selected, a relative strength of the selected input signals is adjusted, the adjusted input signals are mixed, and the mixed input signals are applied to the transducer.

Implementations may include one or more of the following features. For example, the first control region and the second control region may include a discrete surround sound level control region as well as a forward fading control region and/or a backward fading control region. A first transition region may separate the surround sound level control region from the forward fading control region, and a second transition region may separate the surround sound level control region from the backward fading control region. The first transition region may include multiple positions for transitioning the adjusted input signals from the surround sound level control region to the forward fading control region, and the second transition region may include multiple positions for transitioning the adjusted input signals from the surround sound level control region to the backward fading control region.

The first control region and the second control region may be further divided into multiple possible positions for a control device. Adjacent positions may be separated by a discrete step size. The discrete step size may represent a change by a predetermined value of the adjusted input signal strength relative to an original input signal strength. Adjusting the relative strength of the selected input signals may further include obtaining control parameters corresponding to the selected input signals and adjusting the signal strength of the selected input signals based on the control parameters. The control parameters may be stored in a table. Obtaining control parameters may further include setting the control parameters to satisfy predetermined criteria, which may relate to optimizing a perceived sound quality and/or maintaining a constant overall system output level.

In another general aspect, systems and methods for controlling a surround sound system that includes multiple input signals and multiple spatially diverse transducers in a listening environment may include defining a plurality of control regions. When operating in a first control region, a relative strength of one or more input signals may be adjusted with respect to other input signals. When operating in a second control region, a relative output level of one or more spatially diverse transducers may be adjusted with respect to other transducers. The output level of one or more of the spatially diverse transducers may include components of two or more of the input signals when operating in the second control region.

Implementations may include one or more of the following features. For example, the first control region may include a surround level control region. A relative strength of one or more surround signals may be adjusted when operating in the surround level control region. The second control region may include a front-rear fading control region. A relative output level of one or more transducers with respect to other transducers may be adjusted when operating in the second control region. The second control region may be further divided into a backward fading control region and a forward fading control region.

In another general aspect, a system for controlling fading and surround level may be provided for a surround sound system with multiple input signals and multiple spatially diverse transducers in a listening environment The system may include a memory for storing control parameters that are used for adjusting a relative strength of input signals. The control parameters may be indexed according to defined positions in a first control region and a second control region. The system may also include a controller for operating in the first control region and the second control region. A signal processor may be operable to process each of the input signals based on the control parameters and to provide each processed signal to a corresponding transducer when the controller is operating in the first control region. The signal processor may also be operable to mix two or more of the input signals based on the control parameters to generate a mixed signal for each transducer and to provide the mixed signal to the corresponding transducer when the controller is operating in the second control region.

Implementations may include one or more of the following features. For example, the listening environment may be an automotive listening environment or a room (e.g., in a theater, home, or other building). The signal processor may be operable to process each input signal by selecting one or more input signals and adjusting a strength of the selected input signals. The controller may be operable to tune to defined positions in the control regions. The controller may comprise a remote controller. The controller may also be mounted in the listening environment. The controller may comprise a rotary switch controller or an increment/decrement controller.

In another general aspect, a surround sound system with multiple input signals and multiple spatially diverse transducers in a listening environment may include a controller for operating in multiple control regions. A signal processor may be provided for adjusting a relative strength of one or more input signals with respect to other input signals when the controller is operating in a first control region. The signal processor may further adjust relative output levels of one or more transducers with respect to other transducers when the controller is operating in a second control region. The relative output levels of one or more transducers may include components of two or more of the input signals when the controller is operating in the second control region.

Implementations may include one or more of the following features. For example, the first control region may include a surround level control region for adjusting a relative strength of one or more surround signals. The second control region may include a front-rear fading control region for adjusting relative output levels between a front set of transducers and a rear set of transducers. The second control region may be further divided into a front-to-rear backward fading control region and a rear-to-front forward fading control region. The controller may be a remote controller or may be mounted in the listening environment.

In another general aspect, a system and method for controlling a surround sound system with multiple input signals and multiple spatially diverse transducers may involve defining a first control region and a second control region for a control device and receiving input signals. When the control device is operating in the first control region, a first set of functions may be performed. In particular, relative strengths of the input signals may be selectively adjusted by adjusting a first subset of the input signals relative to a second subset of the input signals. The adjusted input signals may be applied to transducers, and each of the transducers may receive a corresponding number of input signals. When the control device is operating in the second control region, a second set of functions may be performed. The relative strengths of the input signals may be selectively adjusted, and the adjusted input signals may be applied to the transducers. One or more of the transducers may receive a different number of input signals than when the control device is operating in the first control region.

Implementations may include one or more of the following features. For example, the first subset of input signals may include one or more surround audio source signals, and the second subset of input signals may include one or more front audio source signals. The transducers may include one or more front transducers and one or more surround transducers. Each front transducer may receive one or more front audio source signals and each surround transducer may receive one or more surround audio source signals when the control device is operating in the first control region. When the control device is operating in the second control region, one or more front transducers may receive components of a front audio source signal or signals and a surround audio source signal or signals. In addition or as an alternative, one or more surround transducers may receive components of a front audio source signal or signals and a surround audio source signal or signals when the control device is operating in the second control region.

In yet another general aspect, a system and method for controlling a surround sound system with multiple input signals and multiple spatially diverse transducers may involve defining a first control region and a second control region for a control device and receiving input signals. When the control device is operating in the first control region, relative strengths of a first number of the input signals may be selectively adjusted, and the adjusted input signals may be applied to transducers. When the control device is operating in the second control region, relative strengths of a second, different number of the input signals may be selectively adjusted, and the adjusted input signals may be applied to the transducers.

Implementations may include one or more of the following features. For example, the first number of input signals may include one or more surround audio source signals. The second number of input signals may include one or more surround audio source signals and one or more front audio source signals. Applying the adjusted input signals to the transducers when the control device is operating in the second control region may involve applying one or more adjusted surround audio source signals and one or more adjusted front audio source signals to a surround transducer. Applying the adjusted input signals to the transducers when the control device is operating in the second control region may also involve applying one or more adjusted surround audio source signals and one or more adjusted front audio source signals to a front transducer.

The details of one or more implementations are set forth in the accompanying drawings and the description below. Other features, objects, and advantages will be apparent from the description and drawings, and from the claims.

BRIEF DESCRIPTION OF THE SEVERAL VIEWS OF THE DRAWING

FIG. 3 is an illustrative chart of the various input signals and signal levels applied to each speaker for each position of the control device shown in FIG. 2;

FIG. 5 shows an illustrative chart of the various input signals and signal levels applied to each speaker for each intermediate position of the control device shown in FIG. 4.

Like reference symbols in the various drawings indicate like elements.

DETAILED DESCRIPTION

In typical surround sound applications in a vehicle, it is generally useful to be able to fade the audio image between the front and rear of the vehicle, as well as to be able to adjust the relative level of independent signals, such as the level of the surround signals.

Systems and techniques are described here for providing a single degree of freedom (DOF) control for adjusting multiple audio functions. In particular, a first function may be performed on a first set of signals over a first range of control positions, and one or more other functions may be performed on another set of signals in other ranges of control positions. The number of signals controlled in each range may be different.

In one implementation, a single control device may be used to control both surround signal level and image fader functionality in a surround sound application. The control device performs surround signal level control over a first range of control operation, and performs a fader function over one or more other ranges of control operation. The control device operates only on the surround signal or signals over a portion of an operating range for the control device, and operates on the surround signals and other signals (which may include, e.g., front left, center, and front right signals) over other portions of the operating range. The control device accomplishes both functions in a natural and intuitive manner.

The disclosed system and techniques will be described and illustrated assuming an automotive listening environment. However, the techniques may be applicable to other types of listening environments, such as a living room, theater, and the like.

Figure 1:
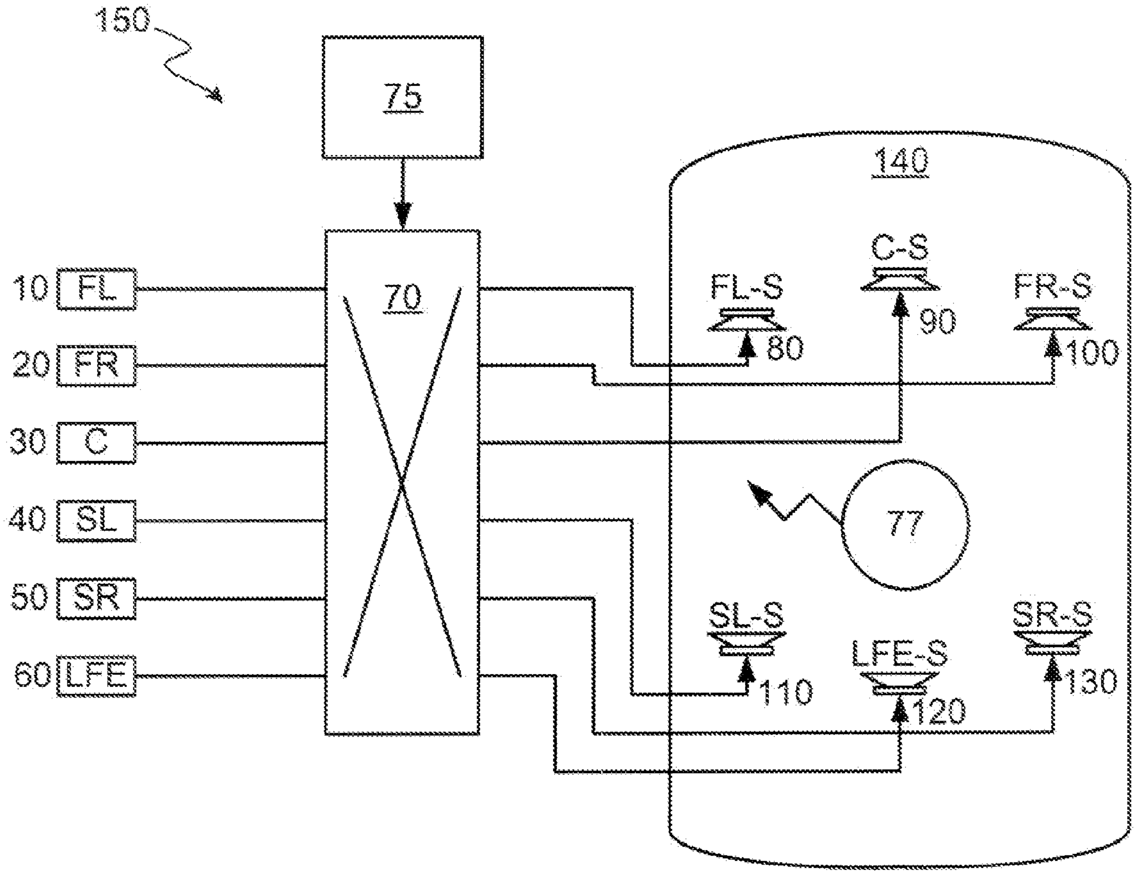
FIG. 1 is a block diagram of a multi-channel discrete surround sound system in an automotive listening environment.

FIG. 1 shows a block diagram of a multi-channel discrete surround sound system in an automotive listening environment. The surround sound system 150 uses a plurality of discrete surround sound source signals corresponding to a front left (FL) channel 10, a front right (FR) channel 20, a center (C) channel 30, a surround left (SL) channel 40, a surround right (SR) channel 50, and a bass or Low Frequency Effects (LFE) channel 60. Although six source signal channels are illustrated and described, the number of source signal channels may vary. For example, the surround sound system 150 may not include a center channel 30 and/or an LFE channel 60. Alternatively, the surround sound system 150 may include a surround center channel (not shown). Thus, the number of source signal channels may be smaller than six or larger than six.

The discrete signals 10-60 are received by a signal processor 70 for operating on the signals 10-60. The signal processor 70 may be implemented in the form of a digital signal processor (DSP) or in analog circuitry. The signal processor 70 performs one or more functions on the various input signals 10-60 to create output signals. One function that may be performed by the signal processor 70 is alteration of signal gain. The signal processor 70 may either attenuate or boost (in either absolute or relative terms) one or more of signals 10-60 based on selected control parameters, as will be described in more detail below.

Another function that may be performed by the signal processor 70 is signal mixing. The signals 10-60 may be mixed together in some fashion within signal processor 70, with variable relative or absolute gain. Signal mixing takes as input a plurality of input signals, mixes together one or more subsets of the input signals, and generates a plurality of output signals. Mixing may include attenuating or boosting the relative level of the input signal subsets to be mixed and summing together the adjusted input signals. Some or all of the output signals may contain components of multiple (i.e., more than one) input signals. The number of input signals may differ from the number of output signals. If the number of output signals is smaller than the number of input signals, the process is referred to as down-mixing. If the number of output signals is greater than the number of input signals, the process is referred to as up-mixing.

The signal processor 70 may perform still other functions on the various input signals to create the output signals. For example, the difference between a pair of signals could be taken and output as a signal. The described techniques are not limited in the functions that can be performed on the input signals and are not limited in the number of input signals or output signals that may be present.

After the desired functions have been performed, the output signals from the signal processor 70 may be selectively sent to a plurality of spatially diverse loudspeakers. The loudspeakers may include a front left speaker (FL-S) 80, a center speaker (C-S) 90, a front right speaker (FR-S) 100, a surround left speaker (SL-S) 110, a low frequency effects speaker (LFE-S) 120, and a surround right speaker (SR-S) 130. The various speakers 80-130 may be installed in a vehicle 140. Similar to the number of source signals, the number of speakers can also be smaller than or larger than six.

The values of the control parameters that may be used to adjust the input (source) signals, with or without mixing, may be selected depending on a variety of factors, such as the location of the loudspeakers and whether the purpose of the signal processing is for surround sound level control or image fading control. The control parameters may also depend on the acoustic characteristics of the listening environment.

Figure 2:
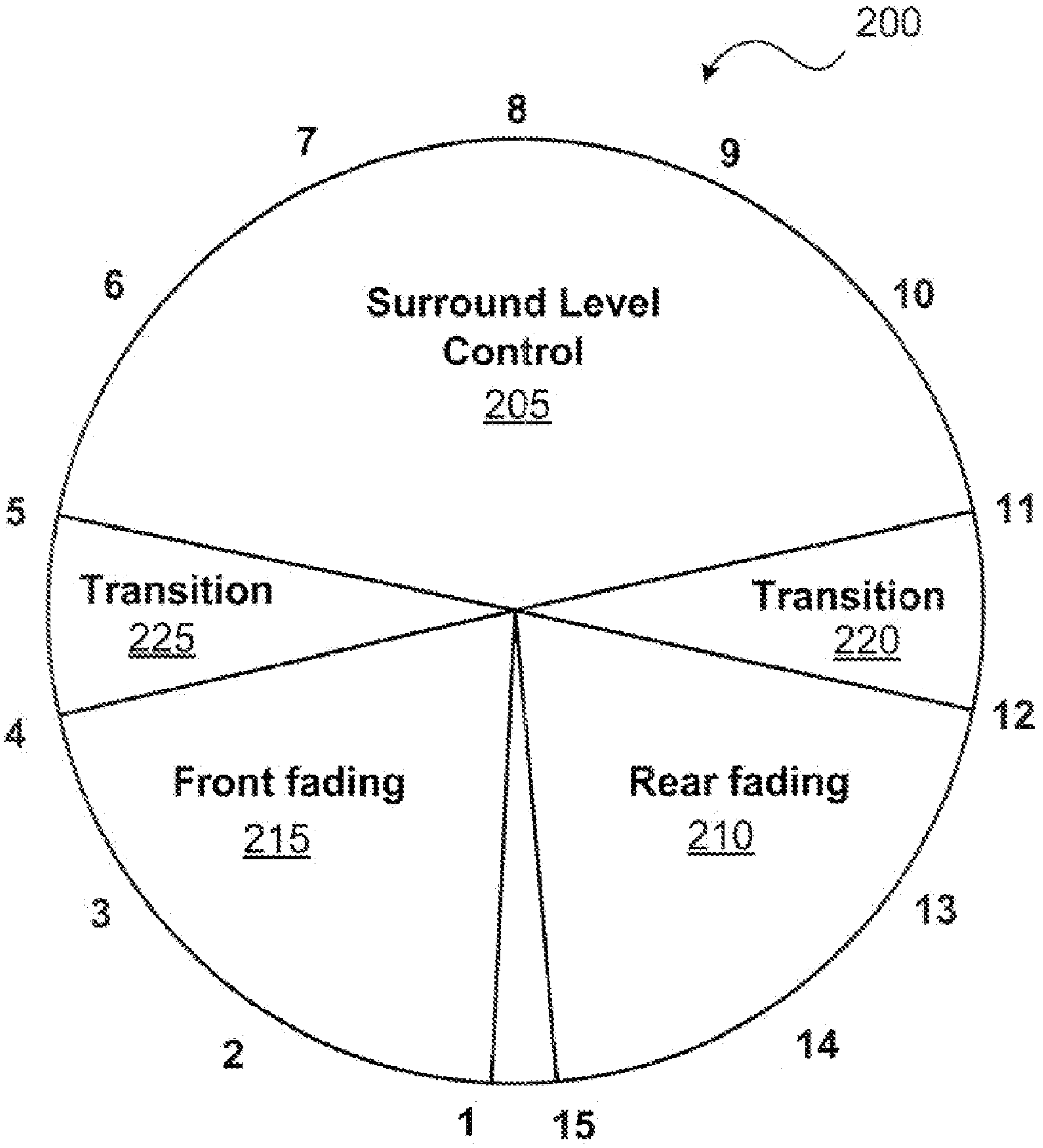
FIG. 2 is a rotary control diagram for a single degree of freedom controller that may be used in a surround sound system.

FIG. 2 shows a rotary control diagram for a single degree of freedom controller that may be used in a surround sound system. The described techniques are not restricted to a rotary control device, however. Other controls such as a slider, or +/− (increment/decrement control) control set, may also be implemented. The control device may include some type of potentiometer for varying an analog signal or control voltage, or may be some type of encoder that outputs a digital code depending on position or actuation of the control device. A digital encoder (which may be rotary, linear, increment/decrement, or some other type of control device) may be used for digital (DSP) implementations.

The control device can be in the form of a remote control or a controller mounted somewhere in the listening environment. The control device may also be located on a component of the surround sound system, such as the control interface unit for a vehicle audio system. For simplicity, the following description assumes use of a rotary control device, although the techniques are equally applicable in connection with other types of control devices.

As illustrated in FIG. 2, the total control region for the rotary control device is divided into a plurality of control regions. In the illustrated implementation, the rotary control device includes five control regions: a surround level control region 205 between positions 5 and 11 clockwise, a rear fading control region 210 between positions 12 and 15 clockwise, a front fading control region 215 between positions 1 and 4 clockwise, a first transition region 220 between positions 11 and 12 clockwise, and a second transition region 225 between positions 4 and 5 clockwise. There are numerous ways to divide the control region, however, and the described techniques are not limited in the manner in which the control regions are divided. For example, the surround sound level control region 205 could be located between positions 4 and 12 clockwise, and front fading and rear fading control regions 210 and 215 could be correspondingly smaller. The control regions could also be divided up asymmetrically, instead of symmetrically as shown in FIG. 2. Greater or fewer numbers of tuning steps (a total of 15 are shown in FIG. 2) may also be used. In some implementations, the number of tuning steps may be sufficiently large that the difference between adjacent tuning steps is virtually imperceptible even when the entire range of tuning steps produces noticeably different audible results. Furthermore, some implementations may not include transition regions 220 and 225 and/or may include only one fading control region.

As an illustrative example, in the surround level control region 205, each clockwise rotation step may increase the surround signal level by 1.5 dB. The surround level control region 205 may simultaneously control a single monophonic surround signal, a stereo pair of surround signals, or multichannel surround signal levels (e.g., left surround, left center surround, right center surround, and right surround, as might be present in a 7.1 channel implementation). In the example of FIG. 2, a total level change (increase) of 9 dB (6*1.5) could be produced by clockwise rotation of the rotary control device from position 5 to position 11. In one implementation, position 8 may correspond to a 0 db surround level adjustment relative to the original input surround signals, position 11 may correspond to a +4.5 dB adjustment relative to position 8 (each step, such as from positions 8 to 9, increases the level by 1.5 dB), and position 5 may correspond to −4.5 dB adjustment relative to position 8 (each step, such as from positions 8 to 7, decreases the level by 1.5 dB). The step sizes described here are used for illustrative purposes and, in actual implementations, can be varied as desired. Additionally, the level change with each step change need not be constant. The level change when moving from position 8 to position 9 may be different from the level change when moving from position 9 to position 10, and so on.

In the rear fading region 210 between position 12 and position 15, the output level of the front speakers (FL-S 80, FR-S 100, and C-S 90) with respect to the rear speakers (SL-S 110, SR-S 130, and LFE-S 120) may be adjusted for each tuning step. This adjustment may be accomplished by operating on the signals that are applied to the different speakers. A different function may be performed when the control device is actuated over the rear fading region 210 portion of the rotary control device's operating range than is performed in the surround level control region 205 (e.g., over the range from positions 5 to 11). Furthermore, the rear fading control region 210 may control a different set of signals (e.g., levels of more than just surround signals may be adjusted).

For example, clockwise rotation of the control device in the rear fading region 210 may cause the signals fed to the rear speakers to be stronger than the signals fed to the front speakers (i.e., a rear fade function). In addition, the signals fed to the rear speakers may have components of the left front, center, and right front input signals. The signals fed to the front speakers may also contain information from the surround input signals. In some implementations, the signals fed to the front and/or rear speakers may also contain information from the low frequency effects input signals.

There are a variety of possible methods to adjust relative output levels of the front and rear speakers. For each clockwise step of the rotary control in the rear fading scenario, fading can be accomplished by: 1) keeping signals fed to the front speakers unchanged and boosting signals fed to the rear speakers; 2) attenuating signals fed to the front speakers and keeping signals fed to the rear speakers unchanged; 3) attenuating signals fed to the front speakers and boosting signals fed to the rear speakers.

In the front fading region 215 between position 1 and position 4, the output level of the rear speakers (SL-S 110, SR-S 130, and LFE-S 120) with respect to the front speakers (FL-S 80, FR-S 100, and C-S 90) may be adjusted for each tuning step. This adjustment may be accomplished by operating on the signals that are applied to the different speakers. A different function may be performed when the control device is actuated over the front fading region 215 portion of the rotary control device's operating range than is performed in the surround level control region 205 (e.g., over the range from positions 5 to 11) and the rear fading region 210 (e.g., over the range from positions 12 to 15). Furthermore, the front fading control region 215 may control a different set of signals.

For example, counter-clockwise rotation of the control device in the front fading region 215 may cause the signals fed to the front speakers to be stronger than the signals fed to the rear speakers (i.e., a front fade function). In addition, the signals fed to the front speakers may have components of the left surround and right surround input signals. The signals fed to the rear speakers may also contain information from the front input signals. In some implementations, the signals fed to the front and/or rear speakers may also contain information from the low frequency effects input signals. The combination of signals may be performed in a different way for operation in the front fading region 215 as compared to operation in the rear fading region 210. For example, operation in the rear fading region 210 may result in signals being fed to the rear speakers that have significant front speaker components, while operation in the front fading region 215 may result in signals being fed to the front speakers that have relatively small surround speaker components.

There are a variety of possible methods to adjust relative output levels of the front and rear speakers. For each counter-clockwise step of the rotary control in the front fading scenario, fading can be accomplished by: 1) keeping signals fed to the rear speakers unchanged and boosting signals fed to the front speakers; 2) attenuating signals fed to the rear speakers and keeping signals fed to the front speakers unchanged; 3) attenuating signals fed to the rear speakers and boosting signals fed to the front speakers.

FIG. 3 shows an illustrative control parameter chart 250 of the various input signals and signal levels applied to each speaker for each position of the control device shown in FIG. 2. The control device may be used for a surround sound application in a vehicle, for example. The surround signal level fed to selected speakers is controlled over a first region of operation. Over other regions, various signals are mixed (summed) together using varying relative and absolute levels and then fed to selected speakers. The control parameter chart 250 of FIG. 3 provides the signal mixing and corresponding control parameter values for a six speaker surround sound configuration, as shown in FIG. 1, that uses the rotary control device depicted in FIG. 2. A horizontal axis 255 of the chart 250 represents the control position 1-15 as shown in FIG. 2. A vertical axis 260 of the chart 250 represents the six speakers (FL-S 80, FR-S 100, C-S 90, SL-S 110, SR-S 130, and LFE-S 120), as shown in FIG. 1. The chart 250 represents one possible implementation of a surround level and fading control system. Other signal mixing combinations and parameter values may be used.

Each cell in FIG. 3 shows the discrete signals that are mixed together for each speaker and each control device position. Each cell also shows control parameters that are to be applied to the discrete signals for each speaker and each control device position. The control parameters represent gain changes relative to the original input signals. For example, for the front left speaker 80, when the control is set at position 1 (see FIG. 2), the discrete front left and surround left signals (FL and SL) are processed with particular gain changes, 0 dB and −1.5 dB respectively (as shown in cell 280), and then mixed together (summed). The mixed signal is fed to the front left speaker 80. For the left surround speaker 110, when the control device is set at position 12 (see FIG. 2), discrete front left, center, and surround left signals (FL, C, and SL) are processed with specific gain changes, −1.5 dB each (as shown in cell 290), and then mixed together. The mixed signal is then fed to the left surround speaker 110. The value of the control parameters may be selected in accordance with certain criteria that relate to, for example, optimizing perceived sound quality and/or maintaining a constant overall system output level.

For the surround level control region 205 (between positions 5 and 11 clockwise), the surround input signals and the front input signals are preserved as discrete. That is, no signal mixing takes place, and only gain changes of surround signals relative to the other signals are implemented. When the control device is set at position 8, all of the discrete signals are passed to the corresponding speaker without any gain change. From position 8, every clockwise rotation step increases the surround signal level or levels (SL and SR signals) by a predetermined amount, such as 1.5 dB. At position 9, the left and right surround signals (SL and SR) will have a gain increase of 1.5 dB (see cells 287-1 and 287-2) while other discrete signals are passed through without modifications. Each additional clockwise rotation step results in a further gain increase for the left and right surround signals. In this example implementation, both the left and right surround signals (SL and SR) have a 2 dB gain change when moving from position 10 to position 11. Thus, signal boosts or attenuations provided by each control step need not be constant. The values used in any particular implementation may be selected depending on expected system and listening environment specifications.

Similarly, starting from position 8, every counterclockwise rotation step decreases the left and right surround signal level or levels (SL and SR signals) by a predetermined amount, such as 1.5 dB. In this example, at position 7, the left and right surround signals (SL and SR) have a gain change of −1.5 dB (see cells 288-1 and 288-2) and all other signals are passed through without modification. Additional counterclockwise rotation steps results in a further gain attenuation for the left and right surround signals.

In the rear fading control region 210 (between positions 12 and 15 clockwise), the audio image is faded to the rear with each clockwise step rotation. For operation in this range, the audio signals passed through the signal processing associated with the control device are no longer maintained as discrete. For example, the audio does not represent discrete multi-channel surround sound, but instead input signals are mixed in some manner. However, all of the surround sound information is still present.

From position 12 (see FIG. 2), every clockwise step rotation makes signals fed to the rear speakers 110 and 130 (SL-S and SR-S) relatively stronger than signals fed to the front speakers 80, 90, and 100 (FL-S, FR-S and C-S). Although a particular implementation is illustrated, there are a variety of possible implementations for adjusting relative signal strength between the front speakers and the rear speakers such as: 1) keeping signals fed to the front speakers unchanged and boosting signals fed to the rear speakers; 2) attenuating signals fed to the front speakers and keeping signals fed to the rear speakers unchanged; 3) attenuating signals fed to the front speakers and boosting signals fed to the rear speakers. Any of these methods, alone or in combination, may be used to effect a fade function. The illustrated example keeps the strength of the signals fed to the rear speakers unchanged and decreases the strength of the signals fed to the front speakers, for clockwise step rotations in the region from positions 12 to 15.

In this example, at position 13, the discrete front left signal (FL) is adjusted by being attenuated by 8 dB, the discrete surround left signal (SL) is adjusted by being attenuated by 10 dB, and the two adjusted signals are mixed and fed to the front left speaker 80 (FL-S) (as shown at cell 295-1). In another implementation, the front left and surround left signals (FL and SL) may be attenuated by the same magnitude, such as 8 dB. In such a case, the signals could be mixed together before being attenuated, rather than after. In other words, if the front left and surround left signals (FL and SL) are attenuated by the same magnitude (e.g., 8 dB), the implementation can feed the front left and surround left signals (FL and SL) to the front left speaker (FL-S) without any pre-adjustment. Instead, the output of the front left speaker 80 may be adjusted to achieve the same 8 db attenuation on both signals FL and SL. Thus, the signal adjustments for a mixing signal scenario can be performed either in the signal processor or in the speakers to which the signals are fed if the adjustment amounts for all the mixed signals are the same. Similarly, the signal adjustments for a discrete signal scenario (such as for the signal fed to the center speaker 90 (C-S)) can be performed either in the signal processor or in the speakers to which the signal is fed.

Different adjustments and mixing are performed at position 13 for the surround speakers as compared to the front speakers. For example, the discrete front left signal (FL) is adjusted by being attenuated by 1.5 dB, discrete center signal (C) is adjusted by being attenuated by 1.5 dB, discrete surround left signal (SL) is adjusted by being attenuated by 1.5 dB, and the three adjusted signals are mixed and fed to the left surround speaker 110 (SL-S) (as shown at cell 295-2).

At position 15, all signals fed to the front speakers 80, 90, and 100 (FL-S, FR-S and C-S) are adjusted to be attenuated by 60 dB (as shown in cells 295-3, 295-4, and 295-5). In this case, virtually no sound can be heard coming from front speakers. The signals fed to the rear speakers 110 and 130 (SL-S and SR-S), on the other hand, are set back to their original levels and combined with unadjusted front signals (as shown in cells 295-6 and 295-7).

In the front fading control region (between positions 1 and 4 clockwise), the audio image is faded to the front with each counterclockwise step rotation. For operation in this range, the audio signals that pass through the signal processing associated with the control device are not maintained as discrete. For example, the audio is not discrete multi-channel surround sound, but instead uses input signals that are mixed in some manner. However, all of the surround sound information is still present.

From position 4, every counterclockwise step rotation makes signals fed to the front speakers 80, 90, and 100 (FL-S, FR-S and C-S) relatively stronger than signals fed to the rear speakers 110 and 130 (SL-S and SR-S). In this example, the strength of the front signals (FL and FR) fed to the front speakers remains unchanged while the strength of the surround signals (SL and SR) fed to the front speakers generally increases with each counterclockwise step rotation. At the same time, the strength of the signals fed to the rear speakers is decreased for counterclockwise step rotations in the region from position 4 to 1. However, there are a variety of possible implementations for adjusting relative signal strength between the front speakers and the rear speakers such as: 1) keeping signals fed to the rear speakers unchanged and boosting signals fed to the front speakers; 2) attenuating signals fed to the rear speakers and keeping signals fed to the front speakers unchanged; 3) attenuating signals fed to the rear speakers and boosting signals fed to the front speakers. Any of the methods, alone or in combination, may be used to effect a fade function.

As a specific example of the front fading control region, at position 3, a discrete front left signal (FL) passes through without any adjustment (having 0 dB control parameter), discrete surround left signal (SL) is adjusted by being attenuated by 3 dB, and the two adjusted signals are mixed and fed to the front left speaker 80 (FL-S) (as shown in cell 285-1). In another implementation, the front left and surround signals FL and SL could be attenuated by the same magnitude, such as 3 dB. In this case, the signals could be mixed together before being attenuated, rather than after. Also at position 3, the discrete front left signal (FL) is adjusted by being attenuated by 9 dB, the discrete surround left signal (SL) is adjusted by being attenuated by 13 dB, and the adjusted signals are mixed and fed to the left surround speaker 110 (SL-S) (as shown in cell 285-2).

At position 1, all signals fed to the rear speakers 110 and 130 (SL-S and SR-S) are adjusted to be attenuated by 60 dB (as shown in cell 285-3 and 285-4). In this situation, virtually no sound can be heard coming from the rear speakers.

The transition region between the surround level control region and the rear fading control region (between positions 11 and 12 clockwise in FIG. 2) serves as a transition region between the surround signal level and rear fade control functions. Similarly, the transition region between the surround level control region and the front fading control region (between positions 5 and 4 counterclockwise in FIG. 2) serves as a transition region between the surround signal level and front fade control functions. These transition regions may be used to make the transition between control functions as smooth as possible. This smoothing can be accomplished by keeping the system output level approximately constant when switching between surround level control and fading functions and by making the transition between non-mixed and mixed signals as continuous as possible.

Figure 4:
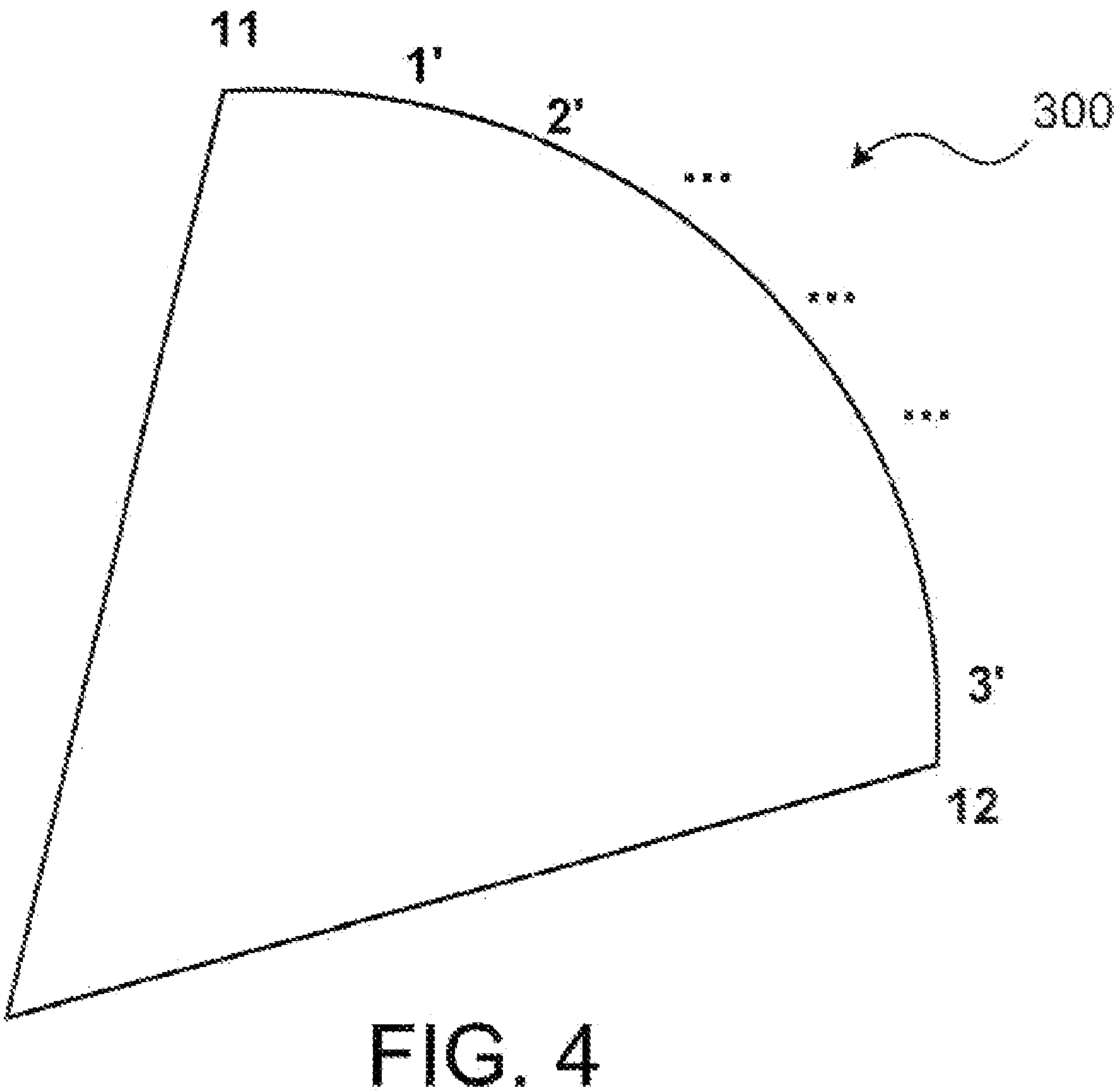
FIG. 4 is a representative diagram of a finer resolution control scheme for the transition region between the surround level control region and the rear fading control region.

FIG. 4 shows a representative diagram of a finer resolution control scheme 300 for the transition region between the surround level control region and the rear fading control region. A similar control scheme may be used for the transition region between the surround level control region and the front fading control region. The finer resolution control scheme 300 includes a plurality of intermediate control positions 1', 2', . . . , and 3'. Each intermediate control position may represent an intermediate level of mixing and an intermediate system output level with respect to positions 11 and 12.

FIG. 5 shows an illustrative control parameter chart 500 of the various input signals and signal levels applied to each speaker for each intermediate position of the control device shown in FIG. 4. The chart represents an example of signal mixing and corresponding gain control parameters values for the transition region between positions 11 and 12. For simplicity, it is assumed that there are three finer intermediate steps between positions 11 and 12, although other numbers of intermediate control positions may be used. A horizontal axis 505 of the chart 500 represents the intermediate control positions 1'-3' as shown in FIG. 4. A vertical axis 510 of the chart 500 represents the six speakers (FL-S 80, FR-S 100, C-S 90, SL-S 110, SR-S 130, and LFE-S 120) as shown in FIG. 1. The chart 500 represents one possible implementation of a transition region for a surround level and fading control system. Other signal mixing combinations and parameter values may be used.

For the front speakers, clockwise step rotations result in an attenuation of the discrete front left, front right, and center signals (FL, FR and C). Surround left and surround right signals (SL and SR) are added to front left and front right signals (FL and FR), respectively, and are boosted at each rotation step. For the rear speakers, the discrete front left and front right signals (FL and FR) are added to the surround left and surround right signals (SL and SR), respectively. In addition, the center signal (C) is added equally to the surround left and surround right signals (SL and SR). The front left, front right, and center signals (FL, FR, and C) are boosted at each rotation step and discrete surround left and surround right signals (SL and SR) are attenuated each step.

For the left front speaker 80 (FL-S), when transitioning from position 11 to 12, the discrete front left signal (FL) will be gradually attenuated from 0 dB at position 11 (as shown at cell 600-1) to −4 dB at position 12 (as shown at cell 600-2). The surround left signal (SL) is gradually mixed in with the discrete front left signal (FL) initially with −60 dB of relative gain (so that it is barely audible) at position 1', and the surround left signal gain is increased with each clockwise step rotation to reach −6 dB at position 12.

For the left surround speaker 110 (SL-S), when transitioning from position 11 to 12 in a clockwise direction, the surround left signal (SL) may be gradually attenuated from 5 dB relative gain at position 11 (as shown at cell 610-1) to −1.5 dB gain at position 12. As the transition is made, front left and center signals (FL and C) are gradually mixed in with the discrete surround left signal (SL). Specifically, discrete front left and center signals (FL and C) are gradually mixed in starting with −60 dB relative gain at position 1', and gains for the front left and center signals (FL and C) are increased with each clockwise step rotation to −1.5 dB at position 12 (as shown at cell 610-2). Other possible implementations of the transition region are possible. For example, other parameter values may be used and alternative mixing methods may be used.

The second transition region between surround level control and forward fading control may use a transition method similar to that shown in FIG. 5.

A number of embodiments of the invention have been described. Nevertheless, it will be understood that various modifications may be made. For example, although the systems and techniques are described primarily in the context of automotive listening environments, the systems and techniques are also applicable in other listening environments. In addition, although certain examples of control parameters are described, the systems and techniques may be used in connection with other control parameters that use two or more control regions to apply different control functions for each control regions. Accordingly, other embodiments are within the scope of the following claims.

What is claimed is:

1. A method for controlling a surround sound system with a plurality of input signals and a plurality of spatially diverse transducers, the method comprising:

defining a first control region and a second control region;

when operating in the first control region, for at least one of the plurality of spatially diverse transducers:

selecting an input signal from a plurality of input signals;

adjusting a relative strength of the selected input signal; and applying the adjusted input signal to the transducer; and when operating in the second control region, for at least one of the plurality of spatially diverse transducers:

selecting at least two input signals from the plurality of input signals;

adjusting a relative strength of the selected input signals;

mixing the adjusted input signals; and applying the mixed input signals to the transducer, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

2. The method of claim 1 wherein the first transition region includes a plurality of positions for transitioning the adjusted input signals from the surround sound level control region to the forward fading control region and the second transition region includes a plurality of positions for transitioning the adjusted input signals from the surround sound level control region to the backward fading control region.

3. The method of claim 1 wherein the first control region and the second control region are further divided into a plurality of positions associated with a control device.

4. The method of claim 3 wherein adjacent positions are separated by a discrete step size.

5. The method of claim 4 wherein the discrete step size corresponds to a change in an adjusted input signal strength relative to an original input signal strength by a predetermined value.

6. The method of claim 1 wherein adjusting the relative strength of the selected input signals further includes:

obtaining control parameters corresponding to the selected input signals; and adjusting the signal strength of the selected input signals based on the control parameters.

7. The method of claim 6 wherein the control parameters are stored in a table.

8. The method of claim 6 wherein obtaining control parameters further includes setting the control parameters to satisfy predetermined criteria.

9. The method of claim 8, wherein the predetermined criteria relate to optimizing a perceived sound quality.

10. The method of claim 9 wherein the predetermined criteria relate to maintaining a constant overall system output level.

11. A method for controlling a surround sound system with a plurality of input signals and a plurality of spatially diverse transducers in a listening environment, comprising:

defining a plurality of control regions, each of the plurality of control regions corresponding to a distinct position range on a single degree of freedom control;

when operating in a first control region of the plurality of control regions, adjusting a relative strength of at least one of a plurality of input signals with respect to other input signals; and when operating in a second control region of the plurality of control regions, adjusting a relative output level of at least one of a plurality of spatially diverse transducers with respect to other transducers, wherein the output level of at least one of the spatially diverse transducers includes components of at least two of the input signals, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

12. The method of claim 11 wherein the first control region comprises a surround level control region, and a relative strength of at least one surround signal is adjusted when operating in the surround level control region.

13. The method in claim 11, wherein the second control region comprises a front-rear fading control region, and a relative output level of at least one transducer with respect to other transducers is adjusted when operating in the second control region.

14. The method of claim 13, wherein the second control region is further divided into a backward fading control region and a forward fading control region.

15. A system for controlling fading and surround level for a surround sound system with a plurality of input signals and a plurality of spatially diverse transducers in a listening environment, the system comprising:

a memory for storing a plurality of control parameters for adjusting a relative strength of a plurality of input signals, wherein the control parameters are indexed according to a plurality of defined positions in a first control region and a second control region;

a controller for operating in the first control region and the second control region;

a signal processor operable to process each of the plurality of input signals based on the control parameters and provide each processed signal to a corresponding transducer when the controller is operating in the first control region; and wherein the signal processor is operable to mix at least two of the input signals based on the control parameters to generate a mixed signal for at least one transducer of the plurality of transducers and provide the mixed signal to the corresponding transducer when the controller is operating in the second control region, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

16. The system of claim 15 wherein the listening environment comprises an automotive listening environment.

17. The system of claim 15 wherein said listening environment comprises a room.

18. The system of claim 15 wherein the signal processor is operable to process each of the input signals by selecting at least one input signal and adjusting a strength of the selected input signals.

19. The system of claim 15 wherein the controller is operable to tune to one of a plurality of defined positions in the plurality of control regions.

20. The system of claim 19, wherein the controller comprises a remote controller.

21. The system of claim 19, wherein the controller is mounted in the listening environment.

22. The system of claim 19 wherein the controller comprises one of a rotary switch controller and an increment/decrement controller.

23. A system for a surround sound system with a plurality of input signals and a plurality of spatially diverse transducers in a listening environment, the system comprising:

a single degree of freedom controller for operating in a plurality of control regions depending on a position of the controller; and a signal processor for adjusting a relative strength of at least one input signal of a plurality of input signals with respect to other input signals when the controller is operating in a first control region of the plurality of control regions, wherein the signal processor further adjusts relative output levels of at least one transducer of a plurality of spatially diverse transducers with respect to other transducers when the controller is operating in a second control region of the plurality of control regions, with the relative output levels of at least one transducer including components of at least two of the input signals when the controller is operating in the second control region, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

24. The system of claim 23 wherein the first control region comprises a surround level control region for adjusting a relative strength of at least one surround signal.

25. The system of claim 23 wherein the second control region comprises a front-rear fading control region for adjusting relative output levels between a front set of transducers and a rear set of transducers.

26. The system of claim 25 wherein the second control region is further divided into a front-to-rear backward fading control region and a rear-to-front forward fading control region.

27. The system in claim 23 wherein the controller comprises a remote controller.

28. The system of claim 23 wherein the controller is mounted in the listening environment.

29. A method for controlling a surround sound system with a plurality of input signals and a plurality of spatially diverse transducers, the method comprising:

defining a first control region and a second control region corresponding to a first range of control positions and a second range of control positions of a single degree of freedom control device;

receiving a plurality of input signals;

when the control device is operating in the first control region:

selectively adjusting relative strengths of the input signals, wherein a first subset of the input signals is adjusted relative to a second subset of the input signals;

applying the adjusted input signals to a plurality of transducers, wherein each of the transducers receives a corresponding number of input signals; and when the control device is operating in the second control region:

selectively adjusting relative strengths of the input signals; and applying the adjusted input signals to the plurality of transducers, wherein at least one of the transducers receives a different number of input signals than is received when the control device is operating in the first control region, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

30. The method of claim 29 wherein the first subset of input signals comprises at least one surround audio source signal and the second subset of input signals comprises at least one front audio source signal.

31. The method of claim 30 wherein the plurality of transducers include at least one front transducer and at least one surround transducer, with each front transducer receiving at least one front audio source signal and each surround transducer receiving at least one surround audio source signal when the control device is operating in the first control region.

32. The method of claim 31 wherein at least one front transducer receives components of at least one front audio source signal and at least one surround audio source signal when the control device is operating in the second control region.

33. The method of claim 31 wherein at least one surround transducer receives components of at least one front audio source signal and at least one surround audio source signal when the control device is operating in the second control region.

34. A method for controlling a surround sound system with a plurality of input signals and a plurality of spatially diverse transducers, comprising:

mapping a first control region to a first range of control positions of a single degree of freedom control device;

mapping a second control region to a second range of control positions of the control device, the second range of control positions distinct from the first range of control positions;

receiving a plurality of input signals;

when the control device is operating in the first control region:

selectively adjusting relative strengths of a first number of the input signals;

applying the adjusted input signals to a plurality of transducers; and when the control device is operating in the second control region:

selectively adjusting relative strengths of a second number of the input signals, wherein the second number differs from the first number; and applying the adjusted input signals to the plurality of transducers, wherein the first control region and the second control region include a discrete surround sound level control region and at least one of a forward fading control region and a backward fading control region; and wherein the second control region includes both a forward fading control region and a backward fading control region, a first transition region separates the surround sound level control region from the forward fading control region, and a second transition region separates the surround sound level control region from the backward fading control region.

35. The method of claim 34 wherein the first number of input signals include at least one surround audio source signal.

36. The method of claim 35 wherein the second number of input signals include at least one surround audio source signal and at least one front audio source signal.

37. The method of claim 36 wherein applying the adjusted input signals to the plurality of transducers when the control device is operating in the second control region comprises applying at least one adjusted surround audio source signal and at least one adjusted front audio source signal to a surround transducer.

38. The method of claim 36 wherein applying the adjusted input signals to the plurality of transducers when the control device is operating in the second control region comprises applying at least one adjusted surround audio source signal and at least one adjusted front audio source signal to a front transducer.

* * * * *